United States Patent
Chou et al.

(10) Patent No.: US 12,265,112 B2
(45) Date of Patent: Apr. 1, 2025

(54) THREE-TERMINAL POWER LINE FAULT LOCATION AND CORRECTION SYSTEM AND METHOD

(71) Applicant: Taiwan Power Company, Taipei (TW)

(72) Inventors: Jui-Nien Chou, Taipei (TW); Shun-Pin Chen, Taipei (TW); Jen-Chung Chen, Taipei (TW)

(73) Assignee: TAIWAN POWER COMPANY, Taipei (TW)

( * ) Notice: Subject to any disclaimer, the term of this patent is extended or adjusted under 35 U.S.C. 154(b) by 295 days.

(21) Appl. No.: 17/864,880

(22) Filed: Jul. 14, 2022

(65) Prior Publication Data

US 2023/0067848 A1 Mar. 2, 2023

(30) Foreign Application Priority Data

Aug. 26, 2021 (TW) ................................ 110131693

(51) Int. Cl.
*G01R 31/08* (2020.01)
(52) U.S. Cl.
CPC ......... *G01R 31/088* (2013.01); *G01R 31/085* (2013.01)

(58) Field of Classification Search
CPC .................................................. G01R 31/088
See application file for complete search history.

(56) References Cited

U.S. PATENT DOCUMENTS

| | | | |
|---|---|---|---|
| 2016/0216311 A1* | 7/2016 | Bazargan | H02H 7/28 |
| 2021/0143633 A1* | 5/2021 | Naidu | H02H 3/063 |
| 2021/0156899 A1* | 5/2021 | Chen | G01R 31/088 |

* cited by examiner

*Primary Examiner* — Hyun D Park
(74) *Attorney, Agent, or Firm* — Muncy, Geissler, Olds & Lowe, P.C.

(57) ABSTRACT

A three-terminal power line fault location and correction system and method, and a computer readable storage medium. An electronic device is electrically connected with a plurality of terminal devices. When a fault occurs at a certain position of the power line, each terminal device detects the fault to generate a fault distance corresponding to the fault. The electronic device corrects the fault distance as follows: the corrected fault distance of one of the terminal devices=(an actual distance between the terminal device and a divergence point+a function of actual distances between the other two terminal devices and the divergence point)*the fault distance corresponding to the terminal device/(the fault distance corresponding to the terminal device+the fault distance corresponding to a function of the actual distances between the other two terminal devices and the divergence point).

6 Claims, 2 Drawing Sheets

THREE-TERMINAL POWER LINE FAULT LOCATION AND CORRECTION SYSTEM AND METHOD

CROSS REFERENCE TO RELATED APPLICATIONS

This Non-provisional application claims priority under 35 U.S.C. § 119(a) on Patent Application No(s). 110131693 filed in Taiwan, Republic of China on Aug. 26, 2021, the entire contents of which are hereby incorporated by reference.

BACKGROUND

Technology Field

The present disclosure relates to a fault location and correction system and, in particular, to a three-terminal power line fault location and correction system and method, and a computer readable storage medium.

Description of Related Art

Power transmission and distribution lines have been rapidly increased and established due to the vigorous development of industry and commerce, and are one of the main equipment for power transmission. Most of the overhead power transmission and distribution lines are exposed to the environment, and the configuration of underground cables is due to the limited space of urban buildings. The design of underground cables is for the sake of safety distance. Therefore, the underground cables have become the main medium for power transmission in urban areas. Transmission and distribution lines are usually very long. Whenever there is a fault, the line maintenance personnel need to rush to the possible site of the fault to conduct an on-site investigation. Sometimes, in order to quickly restore the power, when the line maintenance personnel cannot determine the fault location, the test transmission method may be needed to determine the fault region and isolate the fault. However, this solution often causes secondary fault damage, and even expands the fault range sharply, which can easily shorten the service life of the equipment and increase the time to restore power. Therefore, using the fault location algorithm to narrow the inspection area to find the fault location, which can shorten the recovery time and ensure the power supply quality, is very important.

In order to detect the fault of the power system, and then find out the location of the short circuit or ground fault in the transmission line, the conventional transmission line system uses digital protection relays to perform fault location calculation to obtain the location data of fault location. The digital protection relay can be remotely connected to the control center via network, and it can also remotely change the relay settings. When an event occurs, the control center can also connect the relay via network to retrieve the relevant fault information. The control center can then quick analyze the accident situation based on the fault information and take appropriate actions to shorten the power recovery time. This procedure can provide great help in locating the fault location.

However, the fault location obtained by the digital relays is sometimes still very different from the actual fault location. That is, there is still a problem of poor accuracy, so that the line maintenance personnel cannot determine the fault location at the first time and quickly go to the fault location to perform troubleshooting, resulting in the delay of fault repairing and thus increasing the time required to restore power.

Therefore, it is desired to provide a system and method that can narrow the range of fault location and achieve high fault location accuracy.

SUMMARY

In view of the foregoing, an objective of this disclosure is to provide a three-terminal power line fault location and correction system and method, and a computer readable storage medium. This disclosure can narrow the range of fault location without complex data calculation, quickly and effectively find the location of the fault in the three-terminal power line, thereby shortening the power recovery time and ensuring the power supply quality.

To achieve the above, a three-terminal power line fault location and correction system of this disclosure includes three terminal devices, a power line and an electronic device. The terminal devices are connected to a divergence point of the power line, so that the terminal devices are positioned at three terminals of the power line. The electronic device is electrically connected with the terminal devices. When a fault occurs at a certain position of the power line, each of the terminal devices detects the fault to generate a fault distance corresponding to the fault, and the electronic device corrects the fault distance as follows:

> the corrected fault distance of one of the terminal devices=(an actual distance between the terminal device and a divergence point+a function of actual distances between the other two terminal devices and the divergence point)*the fault distance corresponding to the terminal device/(the fault distance corresponding to the terminal device+a corresponding fault distance with respect to a function of the actual distances between the other two terminal devices and the divergence point).

In addition, this disclosure also provides a three-terminal power line fault location and correction method, which is applied with a fault location and correction system. The fault location and correction system comprises three terminal devices, a power line and an electronic device. The terminal devices are connected to a divergence point of the power line, so that the terminal devices are positioned at three terminals of the power line. The electronic device is electrically connected with the terminal devices. When a fault occurs at a certain position of the power line, the fault location and correction method comprises steps of: each of the terminal devices detecting the fault to generate a fault distance corresponding to the fault; and the electronic device correcting the fault distance as follows: the corrected fault distance of one of the terminal devices=(an actual distance between the terminal device and a divergence point+a function of actual distances between the other two terminal devices and the divergence point)*the fault distance corresponding to the terminal device/(the fault distance corresponding to the terminal device+a corresponding fault distance with respect to a function of the actual distances between the other two terminal devices and the divergence point).

In one embodiment, each of the terminal devices generates the fault distance corresponding to the fault according to an abnormal voltage and an abnormal current caused by the fault.

In one embodiment, each of the terminal devices comprises a relay, and the relay generates the fault distance.

In one embodiment, the function is a maximum value function, a minimum value function, an average value function, or a weighted value function.

In one embodiment, the electronic device is a mobile phone, a tablet computer, a computer, or a server.

In one embodiment, the electronic device comprises a computer readable storage medium.

In addition, this disclosure further provides a computer readable storage medium storing an application software for performing, when loading and running on an electronic device, the above-mentioned fault location and correction method.

As mentioned above, the conventional power line fault location and correction technology, such as the new window location method or the current superposition method, has a complicated calculation process, and needs a large number of calculations with high-level hardware equipment to obtain the corrected fault distance. However, the three-terminal power line fault location and correction system and method of this disclosure can obtain the corrected fault distance of each terminal through relatively simple location calculation. Therefore, compared with the conventional art, the present disclosure utilizes the impedance-based method to improve the accuracy, can narrow the fault location range without complex data calculation, and can quickly and effectively find the fault location of the fault point in the three-terminal line, thereby shortening the power recovery time and ensuring the quality of power supply.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

The three-terminal power line fault location and correction system and method of this disclosure relate to the technology for locating the fault point of a three-terminal power transmission and distribution line, which can narrow the fault location range and accelerate on-site inspection personnel to find the accident site. The present disclosure is applied to, for example, locating and correcting the fault location in the power transmission and distribution line of ultra-high voltage (345 kV), supper-high voltage (161 kV, 69 kV), or lower voltage, and either an overhead power line or an underground cable can apply the technology of this disclosure.

Figure 1:
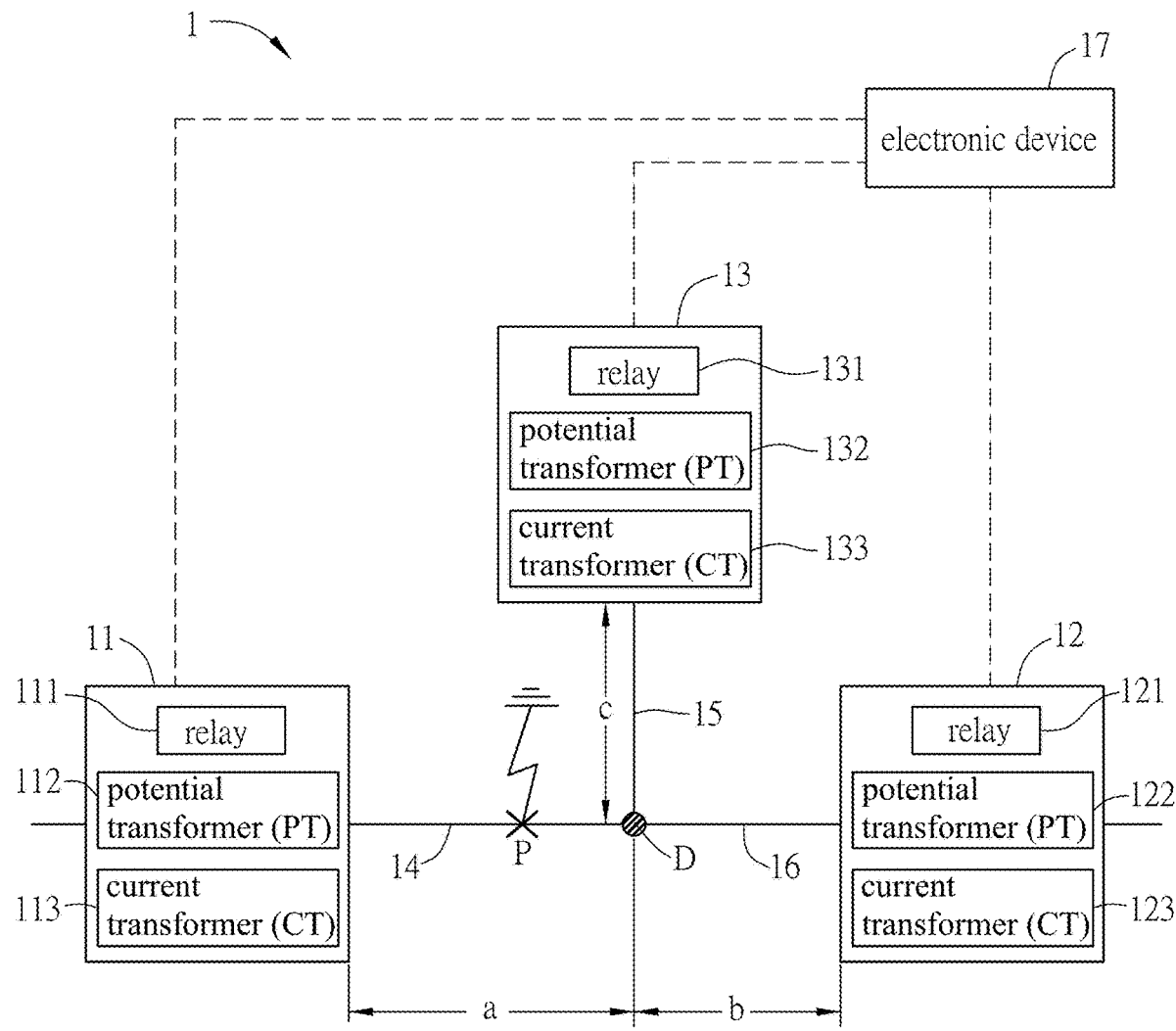
FIG. 1 is a block diagram showing a three-terminal power line fault location and correction system according to an embodiment of this disclosure.
Figure 2:
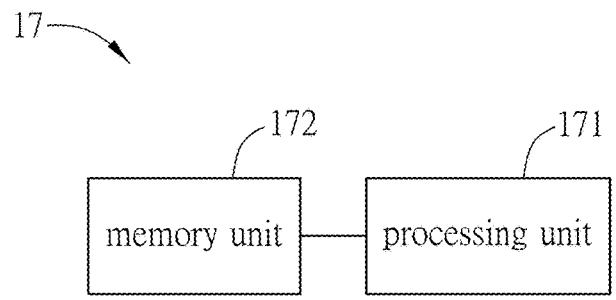
FIG. 2 is a block diagram of an electronic device function in the three-terminal power line fault location and correction system of FIG. 1.
Figure 3:
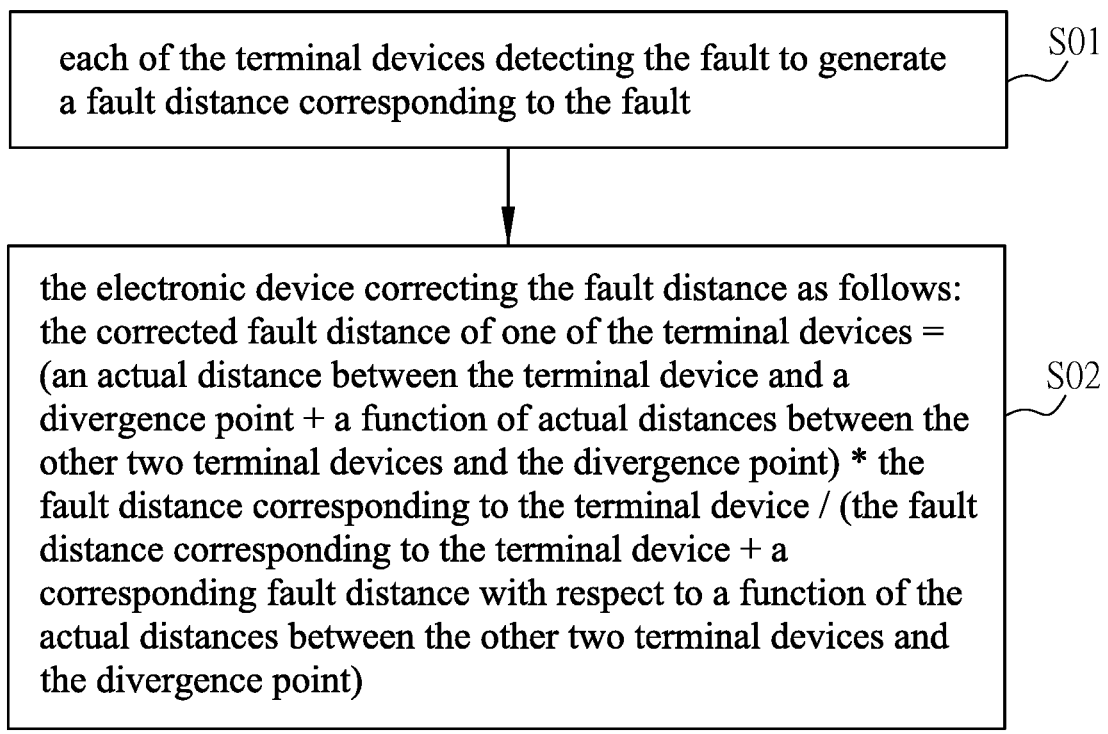
FIG. 3 is a flow chart of a three-terminal power line fault location and correction method according to an embodiment of this disclosure.

An embodiment of this disclosure will be described hereinbelow with reference to FIGS. 1 to 3. FIG. 1 is a block diagram showing a three-terminal power line fault location and correction system according to an embodiment of this disclosure, FIG. 2 is a block diagram of an electronic device in the three-terminal power line fault location and correction system of FIG. 1, and FIG. 3 is a flow chart of a three-terminal power line fault location and correction method according to an embodiment of this disclosure.

A three-terminal power line fault location and correction system 1 of this disclosure includes three terminal devices 11, 12, 13, a power line and an electronic device 17. The power line has a divergence point D, and the terminal devices 11, 12, 13 are connected to the divergence point D, respectively. As shown in FIG. 1, the terminal devices 11, 12, 13 are positioned at three terminals of the power line, respectively. In this embodiment, "power line" is a general term, which indicates any power line connecting the three terminal devices 11, 12, 13, while the terminal devices 11, 12, 13 are the three terminals of the power line. For example, as shown in FIG. 1, the power line may include three power cables (e.g. a first power cable 14, a second power cable 15 and a third power cable 16). The terminal device 11 is connected to the divergence point D through the first power cable 14, the terminal device 13 is connected to the divergence point D through the second power cable 15, the terminal device 12 is connected to the divergence point D through the third power cable 16, and the terminal devices 11, 12 and 13 are respectively located at the three terminals of the power line (the first power cable 14, the second power cable 15 and the third power cable 16). To be noted, this disclosure is not limited thereto. In different embodiments, the power line may include two or more than three power cables (e.g. four power cables).

As shown in FIG. 1, the terminal devices 11, 12 and 13 are located at different locations of the power line (e.g. different substations or transmission and distribution stations) to form the above-mentioned three terminals. In this embodiment, the terminal device 11 and the terminal device 12 are (electrically) connected to each other via the first power line 14 and the third power line 16, and the terminal device 13 is (electrically) connected to the joint of the first power line 14 and the third power line 16 (the divergence point D) via the second power line 15. Herein, each of the first power line 14, the second power line 15 and the third power line 16 can be an overhead power line or an underground cable. The divergence point D is the joint of the first power line 14, the second power line 15 and the third power line 16, and is located between the terminal devices 11, 12 and 13.

Those skilled in the field of electric power should know that in a three-phase power system, the terminal device 11 and the terminal device 12 can be connected through three first power lines 14 and three third power lines 16 (and one ground line), so the electric power can be transmitted from the terminal device 11 to the terminal device 12 through the first power line 14 and the third power line 16 (or from the terminal device 12 to the terminal device 11). Similarly, the terminal device 13 can be connected to the divergence point D through three second power lines 15 (and one ground line), and further connected to the terminal device 11 via the first power line 14 and to the terminal device 12 via the third power line 16. Therefore, the electric power can also be delivered from the terminal device 11 to the terminal device 13 via the first power line 14, the divergence point D, and the second power line 15 (or from the third terminal device 13 to the first terminal device 11). Each of the above-mentioned first power lines 14, second power lines 15, and third power lines 16 may be a single complete power transmission line without a connection point, or may be formed by connecting multiple power transmission lines with connection points, but this disclosure is not limited thereto. For example, two or more than two shorter power lines can be connected to become a longer power line.

When a fault occurs at a certain position P in the power line (the first power line 14, the second power line 15 or the third power line 16), each of the terminal devices 11, 12 and 13 can detect the fault respectively to generate a fault distance corresponding to the fault. In this embodiment, each fault distance is calculated by the terminal device 11, 12 or 13 to obtain the distance between the fault point and the terminal device 11, 12 or 13. In other words, each terminal device 11, 12 or 13 can generate a fault distance corresponding to the fault according to the abnormal voltage and abnormal current caused by the fault, respectively. In this embodiment, the terminal device 11 may include at least one (protection) relay 111, the terminal device 12 may include at least one (protection) relay 121, and the terminal device 13 may include at least one (protection) relay 131. Each of the relays 111, 121 and 131 may generate a fault distance corresponding to the fault. The fault distances in this embodiment are calculated by each of the relays 111, 121 and 131 using their built-in algorithm. Herein, the relays 111, 121 and 131 are, for example but not limited to, differential/ranging relays (the codes of the relays are 87L/21/21N). In different embodiments, each of the terminal devices 11, 12 and 13 may also include other electronic components or units, as long as the electronic components or units can generate the fault distances corresponding to the terminal devices 11, 12 and 13, respectively, according to the abnormal voltages and abnormal currents caused by the fault.

As shown in FIG. 1, in this embodiment, assuming that an event occurs at the position P of the first power line 14 between the terminal device 11 and the divergence point D, and a grounding or short-circuit fault occurs, the relay 111 of the terminal device 11 can detect the abnormal voltage and abnormal current when the first power line 14 has a grounding or short-circuit fault, and then generate the corresponding fault distance. Wherein, A represents the fault distance calculated by the terminal device 11 (that is, the reading value of the fault distance of the relay 111 is A). The relay 121 of the terminal device 12 can detect the abnormal voltage and abnormal current caused by the grounding or short-circuit fault of the first power line 14 through the third power line 16, and then generate the corresponding fault distance. Wherein, B represents the fault distance calculated by the terminal device 12 (that is, the reading value of the fault distance of the relay 121 is B). The relay 131 of the terminal device 13 can detect the abnormal voltage and abnormal current caused by the grounding or short-circuit fault of the first power line 14 through the second power line 15, and then generate the corresponding fault distance. Wherein, C represents the fault distance calculated by the terminal device 13 (that is, the reading value of the fault distance of the relay 131 is C). FIG. 1 is an example where a grounding or short-circuit fault occurs on the first power line 14. Of course, the same is true if a grounding or short-circuit fault occurs on the second power line 15 or the third power line 16.

Those skilled in the field of electric power should know that, in order to enable the relays 111, 121 and 131 to detect the voltages and currents of the power lines, respectively, each of the terminal devices 11, 12 and 13 may further include a potential transformer (PT) and a current transformer (CT), and the sources of the fault signal detected and determined by the relays 111, 121 and 131 are the currents and voltages at the secondary sides of the current transformers 113, 123 and 133 and the potential transformers 112, 122 and 132. When the power line fails, the line voltage will drop instantaneously and the current will rise instantaneously. In some embodiments, the relays 111, 121 and 131 can respectively record the abnormal voltages and abnormal currents of the power lines when the fault occurs, so as to obtain the impedances of the power lines when the fault occurs. The relays 111, 121 and 131 can further compare the line impedances with the average impedances of the power lines (the first power line 14, the second power line 15 and the third power line 16), respectively, so as to after calculation, obtain the fault distance A between the relay 111 and the fault position P, the fault distance B between the relay 121 and the fault position P, and the fault distance C between the relay 131 and the fault position P. In addition, those skilled in the field of electric power also know that the terminal devices 11, 12 and 13 may also include protection relays with other codes (e.g. 50/50N, 51/51N, and the likes) and circuit breakers. When the terminal devices 11, 12 and 13 detect out a fault and a preset condition is reached (e.g. the instantaneous phase-to-phase current exceeds the setting value), a trip signal can be output to control the corresponding circuit breaker to trip, thereby isolating the fault.

The electronic device 17 is electrically connected to the terminal devices 11, 12 and 13 respectively (represented by dotted lines). The electronic device 17 can be, for example but not limited to, a mobile phone, a tablet computer, a computer (desktop computer, notebook computer), or a server, and each of the electrical connections can be a wired or wireless connection. This disclosure is not limited thereto. As shown in FIG. 2, the electronic device 17 of this embodiment may include one or more processing units 171 and a memory unit 172, and the memory unit 172 may be electrically connected to the one or more processing units 171 through, for example, a bus. In this case, FIG. 2 shows one processing unit 171 and one memory unit 172 as an example.

The processing unit 171 may include the core control components of the electronic device 17, such as at least a central processing unit (CPU) and a memory, or any of other control hardware, software or firmware. The processing unit 171 can access the data stored in the memory unit 172. The memory unit 172 can store at least one application software, and the application software can include one or more program instructions. When the one or more program instructions of the application software stored in the memory unit 172 are executed by the processing unit 171, the processing unit 171 can perform the specific work planned by the application software. The memory unit 172 of this embodiment may be a non-transitory computer readable storage medium, such as at least one of a memory, a memory card, an optical disc, a video tape, a computer tape, or any combination thereof. Wherein, the memory may include read-only memory (ROM), flash memory (Flash), field-programmable gate array (FPGA), or other forms of memories or their combinations. In some embodiments, the memory unit 172 can also be a cloud memory located in a cloud device, so the application software can also be stored in the cloud device, and the user can download it from the cloud device to the electronic device 17 for execution.

Those skilled in the field of electric power should know that the fault distances A, B, and C calculated and obtained by the relays 111, 121 and 131 (e.g. distance relays) or other electronic components or units based on the abnormal voltage and current may be inaccurate. Generally, there is a large gap between the obtained fault distances and the actual distance with respect to the location of the fault. Therefore, the three-terminal power line fault location and correction system 1 of this disclosure can be applied to the fault location and correction of the three-terminal power line, and the fault location range can be narrowed without complex data calculation, thereby effectively improving the accuracy of fault location positioning, and speeding up the on-site inspection personnel to find the accident location so as to shorten the power recovery time and ensure the quality of power supply. In this case, when the one or more program instructions of the application software stored in the memory unit 172 of the electronic device 17 are executed by the processing unit 171, the processing unit 171 of the electronic device 17 can process the fault distances A, B and C obtained by the above-mentioned relays 111, 121 and 131 to perform the following fault location and corrections so as to narrow the fault location range.

In this embodiment, the electronic device 17 can correct the fault distances A, B and C as follows: the corrected fault distance of any one of the terminal devices=(an actual distance between the terminal device and a divergence point D+a function of actual distances between the other two terminal devices and the divergence point D)*the fault distance corresponding to the terminal device/(the fault distance corresponding to the terminal device+the fault distance corresponding to a function of the actual distances between the other two terminal devices and the divergence point D). Herein, the above symbol "+" represents "add", "*" represents "multiply", "/" represents "divide". In addition, the above-mentioned "function" can be, for example, a maximum value function, a minimum value function, an average value function, or a weighted value function. In more specific, the above-mentioned function (f) can generate the maximum value (max), the minimum value (min), the average value (avg), or the weighted value of the actual distances between the other two terminal devices and the divergence point D respectively.

As shown in FIG. 1, the actual distance between the terminal device 11 and the divergence point D is a, the actual distance between the terminal device 12 and the divergence point D is b, and the actual distance between the terminal device 13 and the divergence point D is c, so that the corrected fault distance A' of the terminal device 11=[a+f(b,c)]*A/[A+a corresponding fault distance with respect to f(b,c)].

Similarly, the corrected fault distance B' of the terminal device 12=[b+f(a,c)]*B/[B+a corresponding fault distance with respect to f(a,c)].

Similarly, the corrected fault distance C' of the terminal device 13=[c+f(a,b)]*C/[C+a corresponding fault distance with respect to f(a,b)].

Therefore, the corrected fault distances A', B' and C' of the corresponding terminal devices 11 12, and 13 can be obtained by the above-mentioned simple calculation formulas, and the power line maintenance personnel can refer to the corrected fault distances A', B' and C' to reduce the fault location range. As a result, the on-site maintenance personnel can quickly find the accident location, thereby shortening the power recovery time, and ensuring the quality of power supply.

In different embodiments, if the first power line 14 and the third power line 16 are integrated into one power line, the entire power line may also include only two power lines, which include one power line for connecting the terminal device 11 and the terminal device 12, and one power line for connecting the terminal device 13 and the divergence point D.

Moreover, as shown in FIG. 3, this disclosure further provides a three-terminal power line fault location and correction method, which is applied with the fault location and correction system 1. The detailed technical features of the fault location and correction system 1 can be referred to the above embodiment, so the detailed description thereof will be omitted here. When a fault occurs at a certain position of the power line, the fault location and correction method comprises steps of: each of the terminal devices detecting the fault to generate a fault distance corresponding to the fault (step S01); and the electronic device correcting the fault distance as follows: the corrected fault distance of one of the terminal devices=(an actual distance between the terminal device and a divergence point+a function of actual distances between the other two terminal devices and the divergence point)*the fault distance corresponding to the terminal device/(the fault distance corresponding to the terminal device+a corresponding fault distance with respect to a function of the actual distances between the other two terminal devices and the divergence point) (step S01). The detailed content of the fault location and correction method has been disclosed in the above embodiment, so the detailed description thereof will be omitted here.

This disclosure also provides a computer readable storage medium storing an application software for performing, when loading and running on an electronic device, the above-mentioned fault location and correction method, which is to correct the fault distances A, B and C so as to generate the corrected fault distances A', B' and C' of the corresponding terminal devices 11 12, and 13. The computer readable storage medium can be located in an electronic device or a cloud device, and this disclosure is not limited thereto.

To be noted, if the fault power line has more than three terminals, such as a power line with four terminals or more, it is necessary to exclude the terminal(s) that do not provide the fault current(s) or not enable the circuit breaker, and then degrade the power line to a three-terminal power line, and then to correct the fault distances following the above-mentioned fault location and correction method, thereby obtaining the corrected fault distances.

The accident information of power lines with three or more terminals (2020) is inputted to the fault location and correction method of this disclosure for verification. The result proves that the fault location and correction method of this disclosure can effectively improve the accuracy of fault location positioning, narrow the fault location range, and speed up on-site inspection personnel for finding out the fault location.

In summary, the conventional power line fault location and correction technology, such as the new window location method or the current superposition method, has a complicated calculation process, and needs a large number of calculations with high-level hardware equipment to obtain the corrected fault distance. However, the three-terminal power line fault location and correction system and method of this disclosure can obtain the corrected fault distance of each terminal through relatively simple location calculation. Therefore, compared with the conventional art, the present disclosure utilizes the impedance-based method to improve the accuracy, can narrow the fault location range without complex data calculation, and can quickly and effectively find the fault location of the fault point in the three-terminal line, thereby shortening the power recovery time and ensuring the quality of power supply.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A three-terminal power line fault location and correction system, comprising:

three terminal devices, a first power line, a second power line and a third power line, wherein the three terminal devices are respectively connected to a divergence point through the first, second and third power lines, so that the three terminal devices are respectively positioned at three terminals of the first, second and third power lines, there is respectively an actual distance between the terminal device and the divergence point, wherein each of the terminal devices comprises a relay, a current transformer and a potential transformer; and an electronic device electrically connected with the terminals devices, the electronic device comprises one or more processing units and a memory unit electrically connected to each other, the one or more processing units can access the data stored in the memory unit;

wherein, when a fault occurs at a fault position on one of the first, second or third power lines, the following procedures are executed:

each of the three terminal devices respectively records an abnormal voltage and an abnormal current caused by the fault at the secondary side of the current transformer and the potential transformer so as to respectively obtain the line impedances of the first, second and third power lines;

each of the relays compares the line impedance with the average impedances of the first, second and third lines, respectively, so as to after calculation, respectively, so as to after calculation, respectively obtain a fault distance between the three relays and the fault position; and based on the fault distances obtained by the relays and the actual distances between the terminal devices and the divergence point, the one or more processing units of the electronic device corrects the fault distance as follows so as to narrow the fault location range:

the corrected fault distance of any one of the terminals devices=(an actual distance between the any one of the terminal device and a divergence point+a maximum value function of actual distances between the other two terminal devices and the divergence point) * the fault distance corresponding to the any one of the terminal device/(the fault distance corresponding to the any one of the terminal device+a corresponding fault distance with respect to a maximum value function of the actual distances between the other two terminal devices and the divergence point).

2. The fault location and correction system of claim 1, wherein the electronic device is a mobile phone, a tablet computer, a computer, or a server.

3. The fault location and correction system of claim 1, wherein the memory unit of the electronic device is a non-transitory computer readable storage medium.

4. A three-terminal power line fault location and correction method, which is applied with a fault location and correction system, the fault location and correction system comprising three terminal devices, a first power line, a second power, a third power line and an electronic device, the three terminal devices being respectively connected to a divergence point through the first, second and third power lines and respectively positioned at three terminals of the first, second and third power lines, there is respectively an actual distance between the terminal device and the divergence point, wherein each of the terminal devices comprises a relay, a current transformer and a potential transformer, the electronic device being electrically connected with the three terminal devices, the electronic device comprises one or more processing units and a memory unit electrically connected to each other, the one or more processing units can access the data stored in the memory unit;

the fault location and correction method comprising step of:

detecting occurrence of a fault at a fault position on one of the first, second or third power lines;

respectively recording, by each of the three terminal devices, an abnormal voltage and an abnormal current caused by the fault at the secondary side of the current transformer and the potential transformer so as to respectively obtain the line impedances of the first, second and third power lines;

comparing, by each of the relays, the line impedance with the average impedances of the first, second and third power lines, respectively, so as to after calculation, respectively obtain a fault distance between the three relays and the fault position; and based on the fault distances obtained by the relays and the actual distances between the terminal devices and the divergence point, correcting, by the one or more processing units of the electronic device, the fault distance as follows so as to narrow the fault location range:

wherein the corrected fault distance of any one of the terminals devices=(an actual distance between the any one of the terminal device and a divergence point+a maximum value function of actual distances between the other two terminal devices and the divergence point) * the fault distance corresponding to the any one of the terminal device/(the fault distance corresponding to the any one of the terminal device+a corresponding fault distance with respect to a maximum value function of the actual distances between the other two terminal devices and the divergence point).

5. The fault location and correction method of claim 4, wherein the electronic device is a mobile phone, a tablet computer, a computer, or a server.

6. The fault location and correction method of claim 4, wherein the memory unit of the electronic device is a non-transitory computer readable storage medium.

* * * * *